(12) United States Patent
Park et al.

(10) Patent No.: US 11,664,243 B2
(45) Date of Patent: May 30, 2023

(54) SUBSTRATE PROCESSING APPARATUS

(71) Applicant: Samsung Electronics Co., Ltd., Suwon-si (KR)

(72) Inventors: Sang-jine Park, Suwon-si (KR); Seung-ho Lee, Seoul (KR); Bo-wo Choi, Suwon-si (KR); Yong-sun Ko, Suwon-si (KR); Woo-gwan Shim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 316 days.

(21) Appl. No.: 16/440,201

(22) Filed: Jun. 13, 2019

(65) Prior Publication Data
US 2020/0194284 A1 Jun. 18, 2020

(30) Foreign Application Priority Data
Dec. 18, 2018 (KR) .................. 10-2018-0164311

(51) Int. Cl.
*H01L 21/67* (2006.01)
(52) U.S. Cl.
CPC .. *H01L 21/67063* (2013.01); *H01L 21/67115* (2013.01); *H01L 21/67259* (2013.01)
(58) Field of Classification Search
None
See application file for complete search history.

(56) References Cited

U.S. PATENT DOCUMENTS

| 5,947,134 | A * | 9/1999 | Kim ..................... H01L 21/681 134/57 R |
| 6,720,522 | B2 * | 4/2004 | Ikegami ............. B23K 26/0732 219/121.69 |
| 7,799,166 | B2 * | 9/2010 | Whitefield ............. H01L 21/68 156/345.15 |
| 8,043,467 | B2 * | 10/2011 | Nanba ............... H01L 21/67051 156/345.13 |
| 8,410,394 | B2 | 4/2013 | Millman, Jr. et al. |
| 8,585,391 | B2 * | 11/2013 | Kim ......................... G03F 1/82 425/174.4 |

(Continued)

FOREIGN PATENT DOCUMENTS

| JP | 2016-107272 A | 6/2016 |
| JP | 2016-115893 A | 6/2016 |
| KR | 10-2016-0110780 A | 9/2016 |

OTHER PUBLICATIONS

Machine Generated English Translation of JP 2016-107272 held to Yoshiyuki et al published Jun. 20, 2016. (Year: 2016).*

(Continued)

*Primary Examiner* — Sylvia MacArthur
(74) *Attorney, Agent, or Firm* — Harness, Dickey & Pierce, P.L.C.

(57) ABSTRACT

A substrate processing apparatus includes: a spin chuck, on which a substrate is mounted, the spin chuck rotating the substrate; At least one of a chemical liquid nozzle configured to provide a chemical liquid to a surface of the substrate and a deionzed water nozzle configured to provide a deionized water to a surface of the substrate; and a laser device configured to emit a pulse waver laser beam having a period of $10^{-9}$ seconds or less for etching an edge of the substrate.

10 Claims, 16 Drawing Sheets

(56) References Cited

U.S. PATENT DOCUMENTS

| | | | | |
|---|---|---|---|---|
| 8,991,329 B1* | 3/2015 | Park | ................ | H01L 21/02282 |
| | | | | 118/500 |
| 9,024,233 B2* | 5/2015 | Jacobson | ............ | H01L 31/1876 |
| | | | | 219/121.76 |
| 9,703,186 B2* | 7/2017 | Kim | ................ | G03F 1/62 |
| 9,900,458 B2* | 2/2018 | Kang | ................ | F16K 99/0044 |
| 2005/0205521 A1* | 9/2005 | Kume | ................ | H01L 21/31111 |
| | | | | 257/E21.255 |
| 2007/0119837 A1* | 5/2007 | Nishiya | ................ | B23K 26/146 |
| | | | | 219/121.84 |
| 2007/0123064 A1* | 5/2007 | Shinoda | ................ | H01R 35/02 |
| | | | | 439/31 |
| 2008/0070378 A1* | 3/2008 | Yeo | ................ | B23K 26/08 |
| | | | | 438/460 |
| 2008/0277061 A1* | 11/2008 | Kobayashi | ........ | H01L 21/02087 |
| | | | | 700/95 |
| 2011/0024400 A1* | 2/2011 | Rumsby | ................ | B23K 26/066 |
| | | | | 219/121.61 |
| 2011/0083696 A1* | 4/2011 | Nasr | ................ | H01L 21/67028 |
| | | | | 134/1.1 |
| 2011/0139757 A1* | 6/2011 | Millman, Jr. | ........ | B23K 26/142 |
| | | | | 219/121.68 |
| 2013/0330064 A1* | 12/2013 | Li | ................ | H01L 21/67253 |
| | | | | 392/407 |
| 2014/0051258 A1* | 2/2014 | Izumoto | ............ | H01L 21/30604 |
| | | | | 438/748 |
| 2014/0148017 A1* | 5/2014 | Adams | ............ | H01L 21/67115 |
| | | | | 438/795 |
| 2015/0050468 A1* | 2/2015 | Reichenbach | ..... | B23K 26/0006 |
| | | | | 347/225 |
| 2016/0309140 A1* | 10/2016 | Wang | ................ | H04N 5/3765 |
| 2016/0372317 A1 | 12/2016 | Lee et al. | | |
| 2018/0211832 A1* | 7/2018 | Hasimoto | ......... | H01L 21/02087 |
| 2020/0090934 A1* | 3/2020 | Kitahara | ............. | H01L 21/6836 |
| 2020/0194284 A1* | 6/2020 | Park | ................ | H01L 21/67063 |

OTHER PUBLICATIONS

Machine Generated English Translation of JP 2016-115893 held to Yoshiyuki et al published Jun. 23, 2016. (Year: 2016).*

Machine Generated English Translation of Bib/Abstract of JP 2016-115893 held to Yoshiyuki et al published Jun. 23, 2016. (Year: 2016).*

Machine Generation of claims of KR20160110780. Published Sep. 22, 2016. (Year: 2016).*

Machine Generation of description of KR20160110780. Published Sep. 22, 2016. (Year: 2016).*

* cited by examiner

SUBSTRATE PROCESSING APPARATUS

CROSS-REFERENCE TO RELATED APPLICATION

This application claims the benefit of Korean Patent Application No. 10-2018-0164311, filed on Dec. 18, 2018, in the Korean Intellectual Property Office, the disclosure of which is incorporated herein in its entirety by reference.

BACKGROUND

Example embodiments of the inventive concepts relate to a substrate processing apparatus. For example, at least some example embodiments relate to a substrate processing apparatus that cleans a substrate by treating foreign matters at edges of the substrate.

A semiconductor device may be manufactured by repeatedly performing various processes such as a thin film deposition process, an etching process, an ion implantation process, etc. on a substrate. During a substrate process, in which the thin film deposition process and the etching process are repeatedly performed, foreign matters may accumulate on an edge of the substrate. When the substrate with the foreign matters on the edge thereof is conveyed to a post-process, the substrate may be damaged due to the foreign matters on the edges in the post-process.

SUMMARY

Example embodiments of the inventive concepts provide a substrate processing apparatus capable of rapidly etching at least one from a front portion, a side portion, and a rear portion at an edge of a substrate while reducing (or, alternatively, preventing) damage to the substrate.

Example embodiments of the inventive concepts provide a substrate processing apparatus capable of rapidly etching only a certain component on an edge of a substrate.

Example embodiments of the inventive concepts provide a substrate processing apparatus capable of reducing (or, alternatively, preventing) adsorption of foreign matters etched by the substrate processing apparatus onto a surface of a substrate.

According to an example embodiment of the inventive concepts, there is provided a substrate processing apparatus including a spin chuck configured to rotate a substrate mounted thereto; At least one of a chemical liquid nozzle configured to provide a chemical liquid to a surface of the substrate and a deionized water nozzle configured to provide a deionized water to a surface of the substrate; and a laser device configured to emit a pulse waver laser beam having a period of $10^{-9}$ seconds or less to etch an edge of the substrate.

According to another example embodiment of the inventive concepts, there is provided a substrate processing apparatus including a spin chuck configured to rotate a substrate mounted thereto; At least one of a chemical liquid nozzle configured to provide a chemical liquid to a surface of the substrate and a deionized water nozzle configured to provide a deionized water to a surface of the substrate; and a first laser device configured to emit a first laser beam to heat the substrate and at least one of the chemical liquid on the substrate and the deionized water on the substrate, the first laser beam being a continuous wave; and a second laser device configured to emit a second laser beam to etch an edge of the substrate, the second laser beam being a pulse wave.

According to an another example embodiment of the inventive concepts, there is provided a substrate processing apparatus including a spin chuck configured to rotate a substrate mounted thereto; a chemical liquid nozzle configured to provide a chemical liquid to a surface of the substrate; a gas nozzle configured to provide a chemical gas to the surface of the substrate; a first laser device configured to emit a first laser beam to heat the substrate and the chemical liquid, the first laser beam being a continuous wave; and a second laser device configured to emit a second laser beam to etch an edge of the substrate, the second laser beam being a pulse wave.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, one or more example embodiments of the inventive concepts will be described in detail with reference to accompanying drawings.

Figure 1:
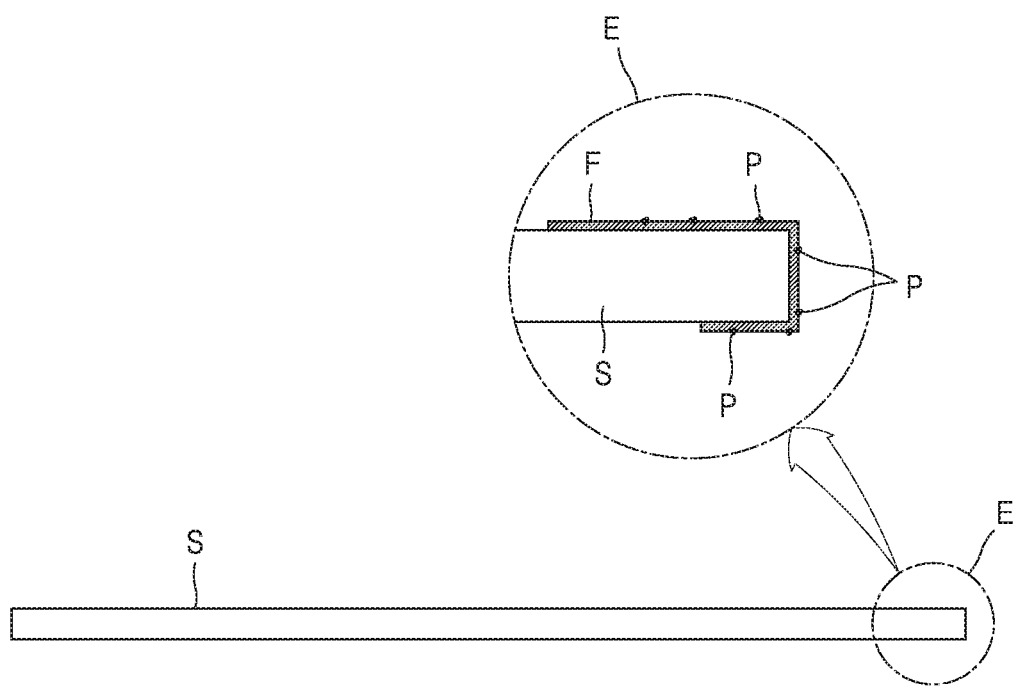
FIG. 1 is a diagram of a substrate and edges of the substrate.

FIG. 1 is a diagram of a substrate S and an edge E of the substrate S.

Referring to FIG. 1, foreign matters may be accumulated on the edge E of the substrate S. In detail, various processes such as a thin film deposition process, an etching process, an ion implantation process, etc. may be performed on the substrate S, and during the processes, foreign matters such as a thin film F and particles P may be accumulated on the edge E of the substrate S.

The foreign matters on the edge E of the substrate S may physically damage the substrate S during post-processes. In detail, the thin film F on the edge E of the substrate S has a different thermal expansion coefficient from that of the substrate S, and thus, the thin film F may cause a bending effect of the substrate S during a post-process for applying heat to the substrate S. Also, the particles P on the edge E of the substrate S may infiltrate into the substrate S during the post-process and may contaminate the substrate S. Therefore, a process of removing the foreign matters such as the thin film F and the particles P from the edge E of the substrate S may be desired.

As shown in FIG. 1, the foreign matters such as the thin film F and the particles P may be accumulated on a rear portion of the substrate S, as well as a front and side portions of the edge E of the substrate S. Therefore, it may be desirable for the foreign matters on the front, side, and rear portions of the edge E of the substrate S to be rapidly and accurately removed.

Hereinafter, one or more example embodiments for rapidly and accurately removing foreign matters from the edge E of the substrate S will be described in detail with reference to accompanying drawings.

Figure 2:
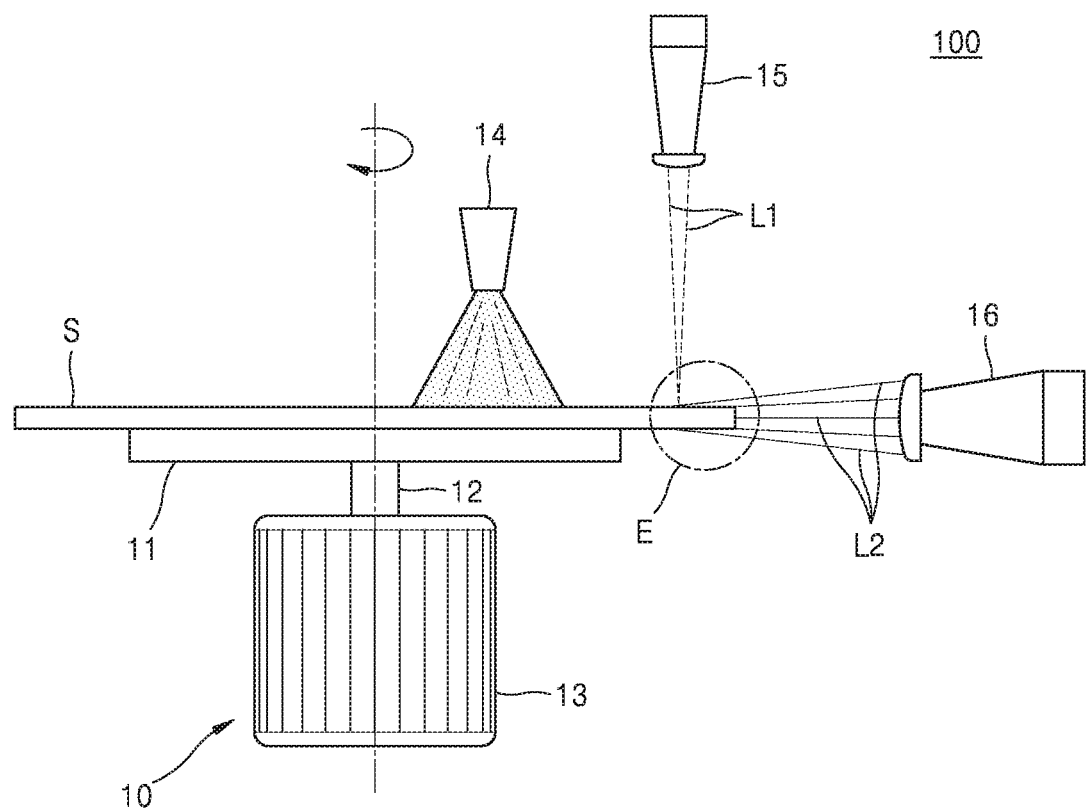
FIG. 2 is a diagram of a substrate processing apparatus according to an example embodiment.

FIG. 2 is a diagram of a substrate processing apparatus 100 according to an embodiment.

Referring to FIG. 2, the substrate processing apparatus 100 may include a spin chuck 10, a chemical liquid nozzle 14, a first laser device 15, and a second laser device 16.

The spin chuck 10 may include a spin base 11, a rotary shaft 12, and a spin tool 13. The substrate S may be mounted on an upper surface of the spin base 11. The upper surface of the spin base 11 may be flat. The spin base 11 may have a shape that is substantially the same as a shape of the substrate S. For example, the spin base 11 may have a circular shape. An area of the upper surface of the spin base 11 may be less than that of the substrate S. Accordingly, the edge E of the substrate S may be exposed to outside. An electrostatic force may generate between the spin base 11 and the substrate S, and the substrate S may be firmly mounted on the spin base 11 due to the electrostatic force. The spin base 11 may rotate about a central axis. The substrate S firmly mounted on the spin base 11 may rotate by an angular velocity that is substantially the same as an angular velocity of rotation of the spin base 11.

The spin tool 13 may include a power generation device such as a motor that generates a rotating force. The spin tool 13 may be electrically connected to a controller and the motor may be driven according to a control signal of the controller. The spin tool 13 of the spin chuck 10 may transfer the rotating force to the rotary shaft 12 and the rotary shaft 12 of the spin chuck 10 may transfer the rotating force to the spin base 11.

The chemical liquid nozzle 14 of the substrate processing apparatus 100 may provide a chemical liquid for etching the edge E of the substrate S onto the substrate S. The chemical liquid nozzle 14 may be located above the spin chuck 10. The chemical liquid sprayed from the chemical liquid nozzle 14 may be supplied on the substrate S, and the chemical liquid may be applied near the edge E of the substrate S due to a centrifugal force generated by the rotation of the substrate S.

The chemical liquid provided from the chemical liquid nozzle 14 may selectively etch only some of various components included in the substrate S. In more detail, when a process manager wants to selectively etch silicon-based components on the edge E of the substrate S, the process manager may allow a chemical liquid that chemically reacts only with the silicon-based components to be sprayed through the chemical liquid nozzle 14. The chemical liquid may include an alkaline chemical liquid, an acid chemical liquid, a neutral chemical liquid, an organic chemical liquid, etc. However, one or more example embodiments are not limited thereto, that is, the chemical liquid may include various combinations of the above stated chemical liquids. For example, the chemical liquid may include hydrogen fluoride, isopropyl alcohol, etc.

An etching amount of the substrate S by the chemical liquid may be affected by the chemical liquid and a temperature of the substrate S. For example, when heat is applied to the substrate S and the chemical liquid after applying the chemical liquid to the substrate S, an etching amount of the substrate S by the chemical liquid may increase.

The first laser device 15 of the substrate processing apparatus 15 may emit a first laser beam L1. The first laser beam L1 may be condensed in the edge E of the substrate S to which the chemical liquid is applied. The first laser beam L1 emitted from the first laser device 15 may heat the substrate S. The heat of the substrate S may be transferred to the chemical liquid, and accordingly, the chemical liquid may be also heated.

The first laser beam L1 emitted from the first laser device 15 may be a continuous wave that has a relatively long period. The continuous wave may easily heat the substrate S as compared with a pulse wave having a relatively short period. The period of the first laser beam L1 may be measured in units of micro-seconds.

Parameters such as an intensity, a period, etc. of the first laser beam L1 emitted from the first laser device 15 may be adjusted by the process manager. Since the temperatures of the substrate S and the chemical liquid are adjusted by the process manager, an etching amount and an etching speed of the edge E of the substrate S by the chemical liquid may be adjusted.

The temperature of the chemical liquid provided at the edge E of the substrate S may be in a range from about 200° C. to about 1000° C. For example, the chemical liquid may be provided to the substrate S directly at a temperature of about 200° C. to about 1000° C. However, one or more example embodiments are not limited thereto, that is, after the chemical liquid is provided to the substrate S, the temperature of the chemical liquid is appropriately adjusted within a range from about 200° C. to about 1000° C. by the first laser beam L1.

The first laser device 15 may be located above the spin chuck 10. The first laser device 15 may be moved in a diameter direction of the spin base 11 of the spin chuck 10 under the control of the process manager.

The second laser device 16 of the substrate processing apparatus 100 may emit a second laser beam L2. The second laser beam L2 may be condensed on a vicinity of the edge E of the substrate S, and may remove the foreign matters accumulated on the edge E of the substrate S by directly etching the edge E of the substrate S.

The second laser beam L2 emitted from the second laser device 16 may be a pulse wave having a relatively short period. In more detail, the second laser beam L2 may be the ultra-short pulse wave having a period shorter than $10^{-9}$ seconds. For example, the period of the second laser beam L2 emitted from the second laser device 16 may be measured in units of nano-seconds, pico-seconds, or femto-seconds.

When the second laser beam L2 emitted from the second laser device 16 is the ultra-short pulse wave, the second laser beam L2 may rapidly etch the edge E of the substrate S without heating the edge E of the substrate S. Accordingly, a reform region is not formed in the substrate S, and damage to the substrate S may be prevented. Also, an amount of by-products generated by the etching operation of the second laser beam L2 may be reduced.

Parameters such as an intensity, a period, etc. of the second laser beam L2 emitted from the second laser device 16 may be adjusted by the process manager. Accordingly, an etching amount and an etching speed of the edge E of the substrate S may be also adjusted.

The second laser beam L2 emitted from the second laser device 16 may etch at least one portion from the upper portion, the side portion, and the rear portion of the edge E of the substrate S. For example, the second laser beam L2 may only etch the side portion of the substrate S, or may simultaneously etch the upper portion, the side portion, and the rear portion of the substrate S.

The second laser device 16 may be located at a level adjacent to that of the substrate S on the spin chuck 10. As described later, the second laser device 16 may move in at least one of a width direction of the substrate S and a height direction of the substrate S under the control of the process manager.

The substrate processing apparatus 100 includes the chemical liquid nozzle 14 and the first laser device 15, and thus, only a certain component among the various components on the edge E of the substrate S may be selectively etched according to intention of the process manager. Also, the substrate processing apparatus 100 includes the second laser device 16, and thus, the edge E of the substrate S may be rapidly etched while preventing damage to the substrate S. The first laser device 15 and the second laser device 16 may operate simultaneously, and accordingly, an efficiency in the etching process on the edge E of the substrate S may be improved.

Also, since the chemical liquid sprayed from the chemical liquid nozzle 14 of the substrate processing apparatus 100 covers the substrate S according to the rotation of the substrate S due to the spin chuck 10, contamination of the substrate S caused when by-products of the etched edge E of the substrate S are flown and adsorbed onto the surface of the substrate S may be reduced (or, alternatively, prevented).

Figure 3A:
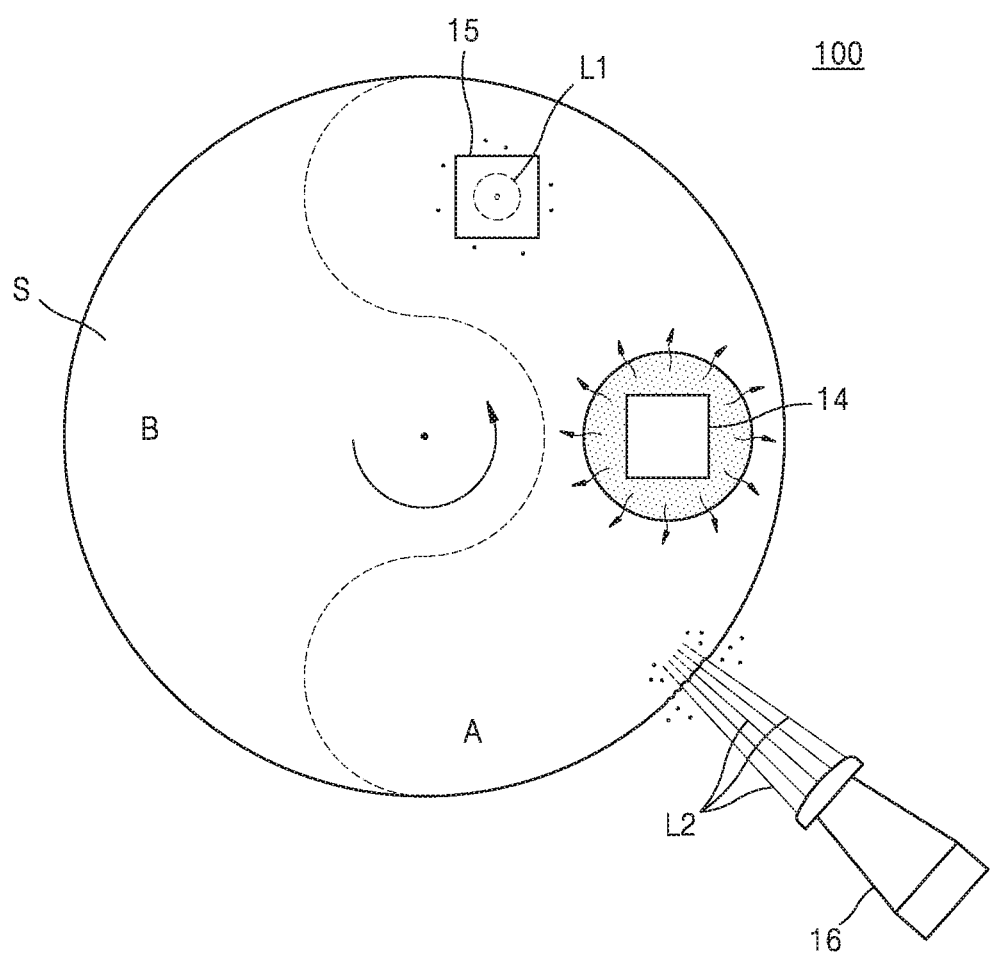
FIGS. 3A and 3B are plan views of a substrate processing apparatus according to an example embodiment.
Figure 3B:
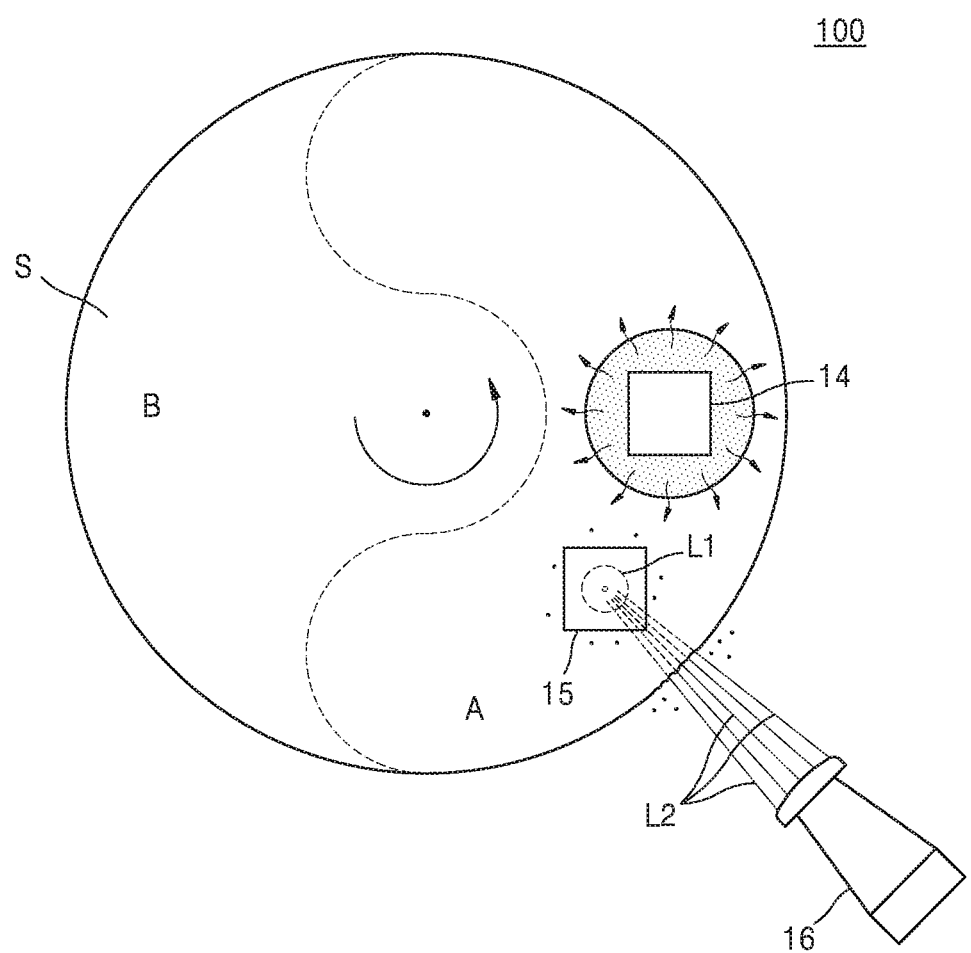

FIGS. 3A and 3B are plan views of the substrate processing apparatus 100 according to an example embodiment.

Referring to FIGS. 3A and 3B, the chemical liquid sprayed from the chemical liquid nozzle 14 of the substrate processing apparatus 100 may be applied to a region near the edge E of the substrate S. Since the substrate S rotates, the chemical liquid sprayed from the chemical liquid nozzle 14 onto the substrate S may be spread on the edge of the substrate S.

Referring to FIGS. 3A and 3B, the first laser device 15 and the second laser device 16 may operate at the same time. However, one or more example embodiments are not limited thereto, that is, the first laser device 15 and the second laser device 16 may operate sequentially.

The first laser beam L1 from the first laser device 15 may be condensed on a region A, in which a relatively large amount of the chemical liquid is applied on the substrate S. As described above, the first laser beam L1 heats the substrate S and the chemical liquid to increase an amount of the substrate S etched by the chemical liquid.

The second laser beam L2 from the second laser device 16 may be condensed on the region A, in which a relatively large amount of the chemical liquid is applied on the substrate S. However, one or more example embodiments are not limited thereto, that is, the second laser beam L2 may be condensed on a region B in which a relatively small amount of the chemical liquid is applied on the substrate S. The second laser beam L2 of the second laser device 16 may be the ultra-short pulse wave as described above, and accordingly, the second laser beam L2 may directly etch the edge E of the substrate S without heating the substrate S and the chemical liquid.

Referring to FIG. 3A, the first laser beam L1 of the first laser device 15 and the second laser beam L2 of the second laser device 16 may be condensed on different locations of the substrate S. Accordingly, the edge E of the substrate S on the spin chuck 10 may be effectively etched. For example, the first laser beam L1 from the first laser device 15 is condensed on the front portion of the edge E of the substrate S to heat the chemical liquid and selectively etch the front portion of the edge E of the substrate S, and at the same time, the second laser beam L2 from the second laser device 16 is condensed on the side and rear portions of the edge E of the substrate S to directly etch the side and rear portions of the edge E of the substrate S.

Referring to FIG. 3B, regions where the first laser beam L1 of the first laser device 15 and the second laser beam L2 of the second laser device 16 are condensed on the substrate S may overlap each other. In more detail, the first laser beam L1 and the second laser beam L2 may overlap each other in the region A in which relatively large amount of the chemical liquid is applied on the substrate S. Since the condensed locations of the first laser beam L1 and the second laser beam L2 overlap each other, the etched amount of the substrate S may be increased at the overlapping portion on the edge E of the substrate S. Accordingly, the edge E of the substrate S may be rapidly etched.

Figure 4:
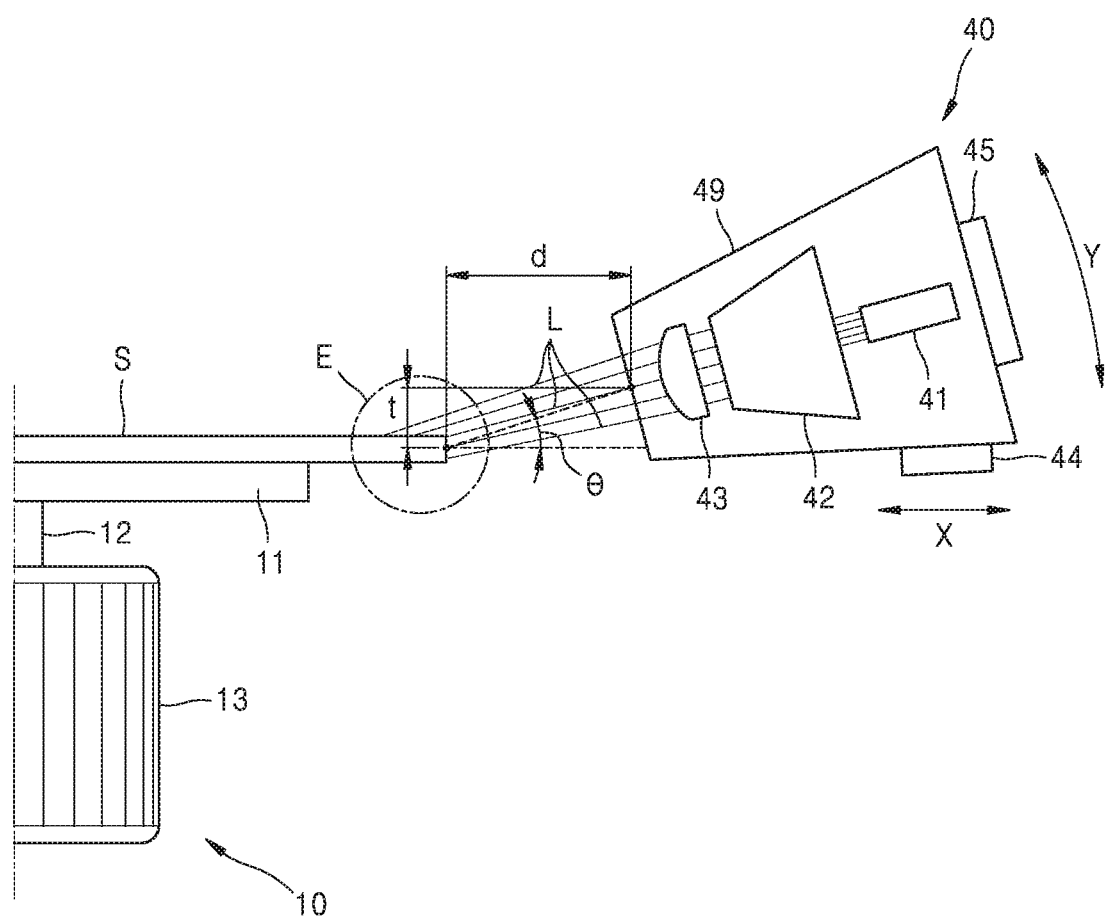
FIG. 4 is a diagram of a laser apparatus according to an example embodiment.

FIG. 4 is a diagram of a laser device 40 according to an example embodiment.

The laser device 40 of some example embodiments may include a laser beam emitting portion 41, a light transfer portion 42, a lens portion 43, a first driver 44, and a second driver 45.

The laser device 40 emits a laser beam to directly etch the edge E of the substrate S and remove foreign matters from the edge E of the substrate S. The laser device 40 may be substantially the same as the second laser device 16 illustrated with reference to FIG. 2.

The laser beam emitting portion 41 of the laser device 40 may emit a laser beam L. In more detail, the laser beam emitting portion 41 may emit the laser beam L for directly etching the edge E of the substrate S as described above. The laser beam L may be an ultra-short pulse wave having a period shorter than $10^{-9}$ seconds. The laser beam L emitted from the laser beam emitting portion 41 may be technically the same as the second laser beam L2 described above with reference to FIG. 2, and detailed descriptions thereof are omitted.

The light transfer portion 42 of the laser device 40 may optically move the laser beam L emitted from the laser beam emitting portion 41. The light transfer portion 42 may include a plurality of lenses for transmitting light, a plurality of reflective mirrors for reflecting light, and an optical splitter for splitting light.

The lens portion 43 may condense the laser beam L transferred by the light transfer portion 42. The lens portion 43 may make the laser beam L converged to a point, and the lens portion 43 may include an aspherical surface having a curved refracting surface.

The laser beam emitting portion 41, the light transfer portion 42, and the lens portion 43 are combined with one another within a container 49 to be controlled as one device.

The first driver 44 and the second driver 45 may drive the laser device 40. In detail, the first driver 44 may drive the laser device 40 in a first direction X, and the second driver 44 may drive the laser device 40 in a second direction Y. In more detail, the first driver 44 may drive the laser device 40 in the first direction X, that is, a width direction of the substrate S on the spin chuck 10, and the second driver 45 may drive the laser device 40 in the second direction Y, that is, a height direction of the substrate S on the spin chuck 10. As shown in FIG. 4, the laser device 40 may be moved while drawing a circular arc by the second driver 45. A center of the circular arc may be located on the substrate S.

The first driver 44 may adjust a horizontal distance d between the laser device 40 and the substrate S, and the second driver 45 may adjust a vertical distance t between the laser device 40 and the substrate S and an incident angle ($\theta$) of the laser beam L with respect to the substrate S.

The laser device 40 may directly etch at least one from the front portion, the side portion, and the rear portion of the edge E of the substrate S, according to the operation of the first driver 44 and the second driver 45.

Figure 5A:
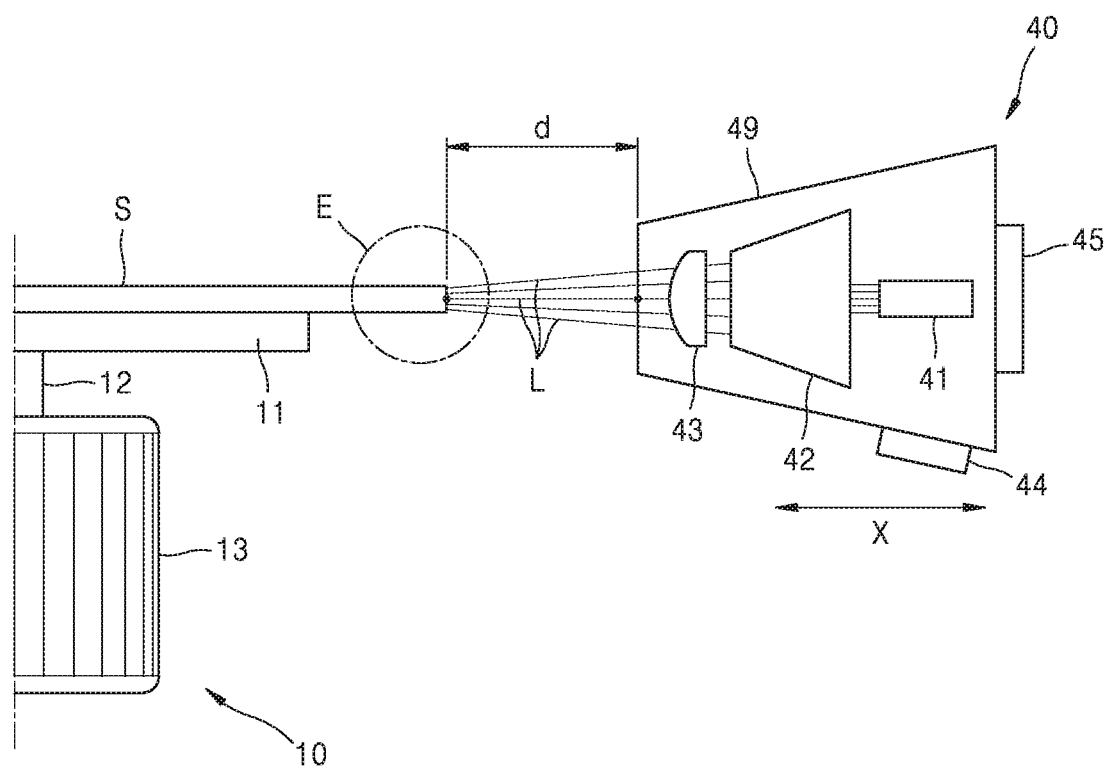
FIGS. 5A to 5C are diagrams illustrating processes of etching edges of a substrate, performed by a laser apparatus according to an example embodiment.
Figure 5B:
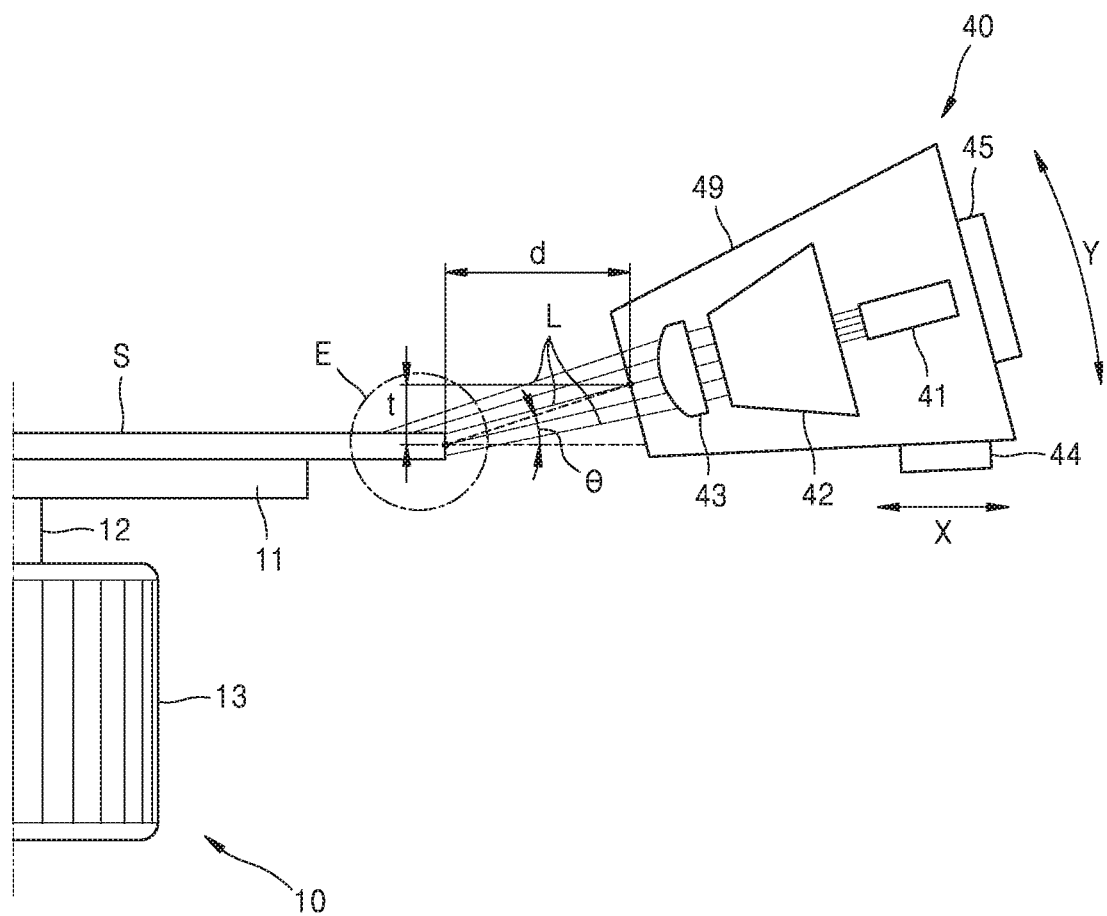
Figure 5C:
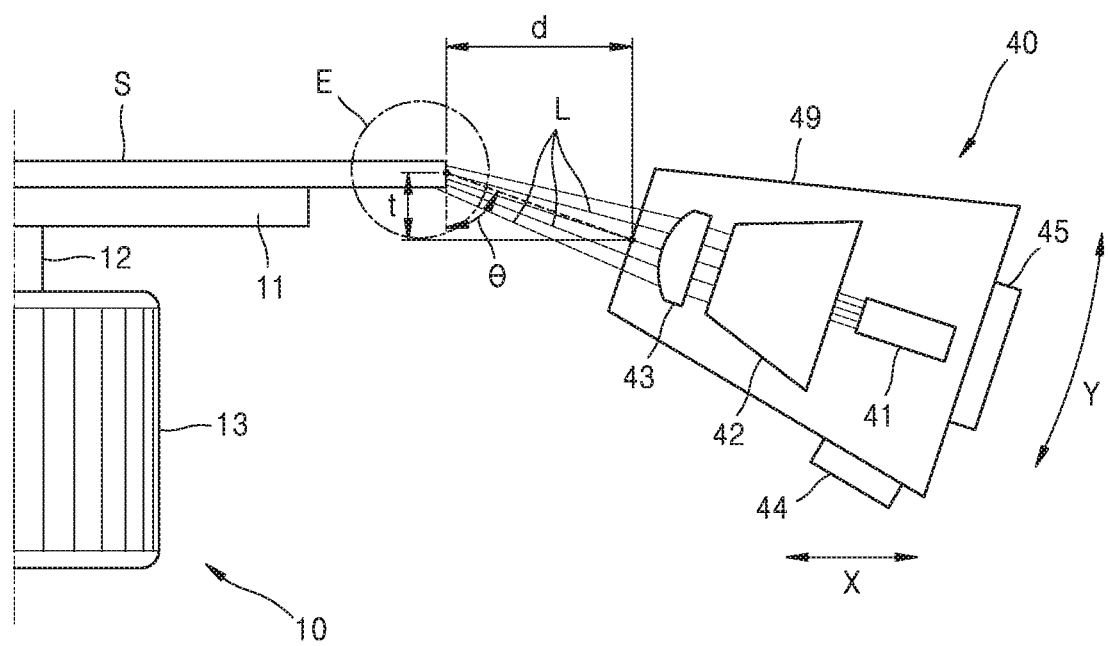

FIGS. 5A to 5C are diagrams illustrating processes of etching the edge E of the substrate S, performed by the laser device 40 according to an example embodiment.

Referring to FIG. 5A, the laser device 40 may directly etch only the side portion of the edge E of the substrate S. The first driver 44 of the laser device 40 may operate in order to etch the side portion of the edge E of the substrate S. The first driver 44 may adjust the horizontal distance d between the laser device 40 and the substrate S to condense the laser beam from the laser device 40 on the side portion of the edge E of the substrate S. Here, the second driver 45 may not operate, and accordingly, the laser device 40 may be located at substantially the same level as that of the substrate S.

Although not shown in FIG. 5A, when the horizontal distance d between the laser device 40 and the substrate S is decreased, the laser device 40 may directly etch the front portion, the side portion, and the rear portion of the substrate S at the same time.

Referring to FIG. 5B, the laser device 40 may directly etch the upper portion and the side portion of the edge E of the substrate S at the same time. In order for the laser beam L of the laser device 40 to etch the upper and side portions of the edge E of the substrate S, the first driver 44 may adjust the horizontal distance d and the second driver 45 may adjust the vertical distance t and the incident angle ($\theta$). Here, the laser device 40 may be located at a higher level than that of the substrate S.

Referring to FIG. 5C, the laser device 40 may directly etch the lower portion and the side portion of the edge E of the substrate S at the same time. In order for the laser beam L of the laser device 40 to etch the lower and side portions of the edge E of the substrate S, the first driver 44 may adjust the horizontal distance d and the second driver 45 may adjust the vertical distance t and the incident angle ($\theta$). Here, the laser device 40 may be located at a lower level than that of the substrate S.

Figure 6:
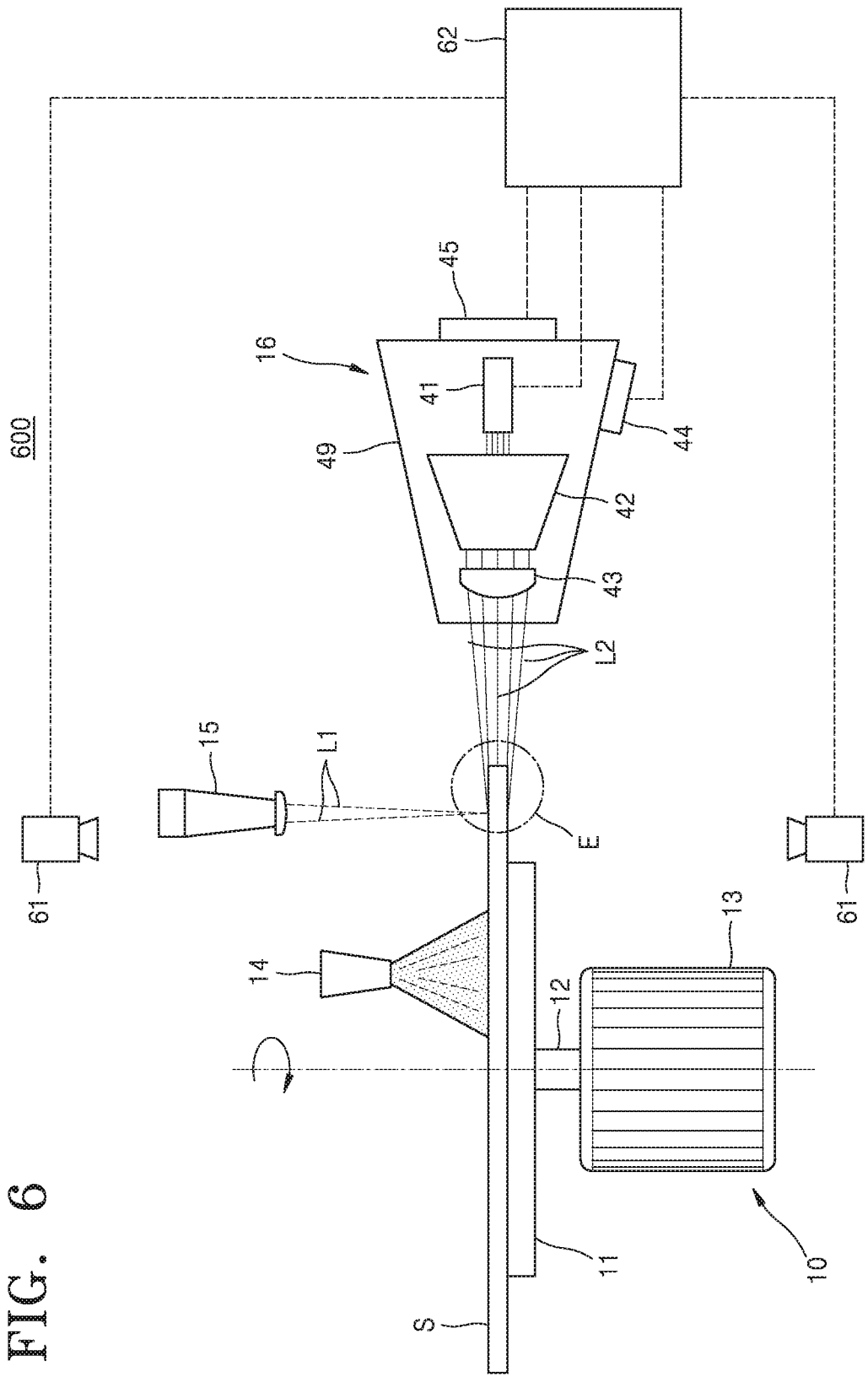
FIG. 6 is a diagram of a substrate processing apparatus according to an example embodiment.

FIG. 6 is a diagram of a substrate processing apparatus 600 according to an example embodiment.

The substrate processing apparatus 600 may include the spin chuck 10, the chemical liquid nozzle 14, the first laser device 15, the second laser device 16, a camera observer 61, and a controller 62.

The spin chuck 10, the chemical liquid nozzle 14, the first laser device 15, and the second laser device 16 are substantially the same as those of FIG. 2, and thus detailed descriptions thereof are omitted.

The camera observer 61 may observe vicinity of the edge E of the substrate S. In more detail, the camera observer 61 may observe a location of the edge E, on which the second laser beam L2 of the second laser device 16 is condensed.

The camera observer 61 may notify the process manager of a status of the etching process at the edge E of the substrate S in real-time.

The controller 62 may be electrically connected to the camera observer 61, the laser beam emitting portion 41 of the second laser device 16, the first driver 44, and the second driver 45.

Through the camera observer 61, the process manager may check a processing status of the etching at the edge E of the substrate, the condensed locations of the first laser beam L1 and the second laser beam L2, etc.

The controller 62 may include a processor and a memory (not shown). The memory may be configured to store computer readable code that, when executed by the processor, configures the processor as a special purpose computer, to perform one or more of the operations of the substrate processing method discussed below with reference to FIG. 12.

For example, the controller 62 may control one or more of the spin chuck 10, the first laser device 14, and the second laser device 16.

The controller 62 may control the second laser device 16 by controlling the laser beam emitting portion 41 according to the processing status of the etching at the edge E of the substrate S to adjust an intensity of the second laser beam L2. In addition, the controller 62 may control the second laser device 16 by operating the first driver 44 and the second driver 45 in order to adjust the condensed location of the second laser beam L2.

In some example embodiments, the controller 62 may also control the first laser device 15 in order to adjust the intensity and/or duration of the first laser beam L1.

Additionally, in some example embodiments, the controller 62 may also generate the control signal to control the motor of the spin tool 13.

Further, in some example embodiments, as discussed below, the controller 62 may also control one or more of (i) liquid supplied from a chemical liquid nozzle 14 and movement of the chemical liquid nozzle 14 by a chemical liquid nozzle arm 83, (ii) deionized water supplied to a deionized water nozzle 81 and movement of the deionized water nozzle 81 by a deionized water nozzle arm 82, and (iii) a chemical gas supplied from a gas nozzle 91 and movement of the gas nozzle 91 by a gas nozzle arm 92.

Figure 7A:
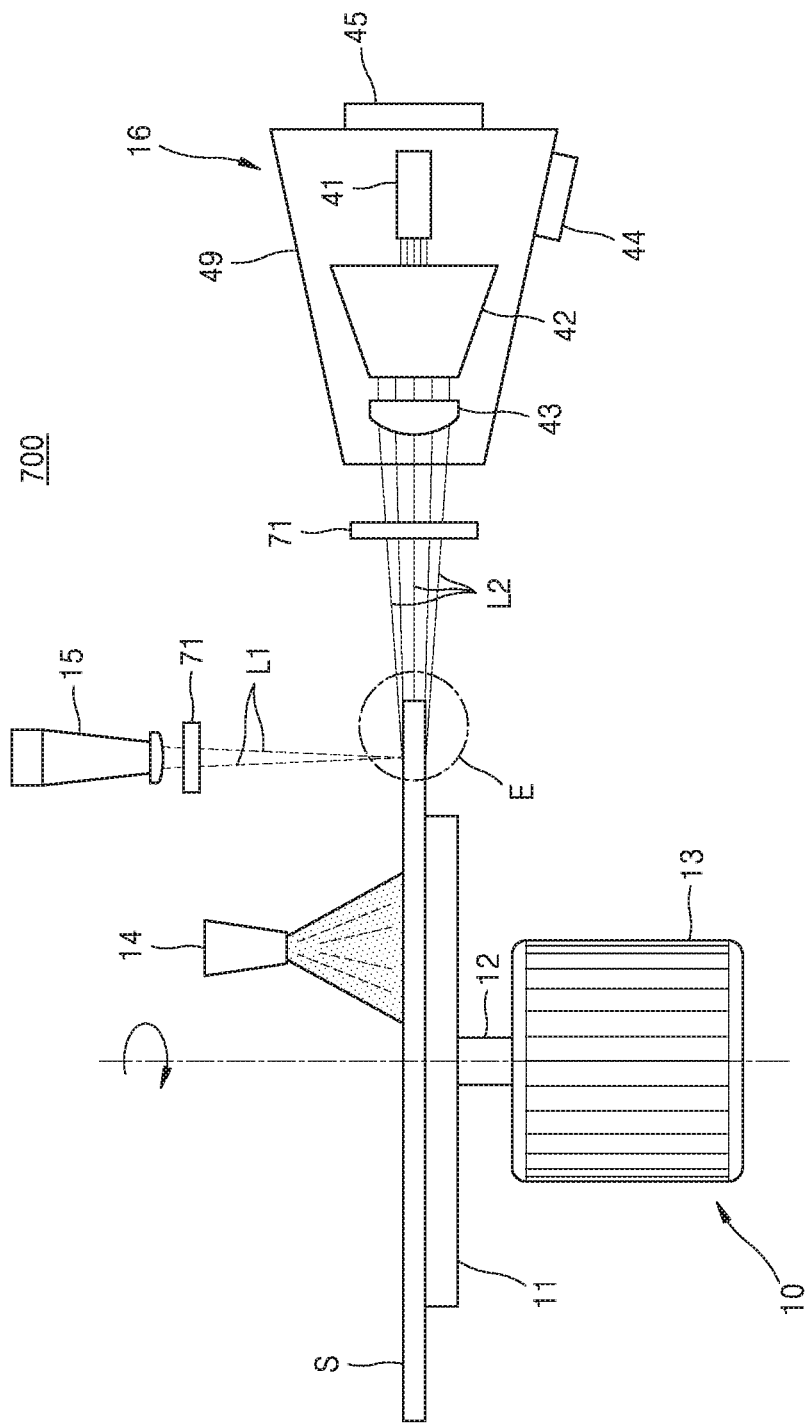
FIGS. 7A and 7B are diagrams of a substrate processing apparatus according to an example embodiment.
Figure 7B:
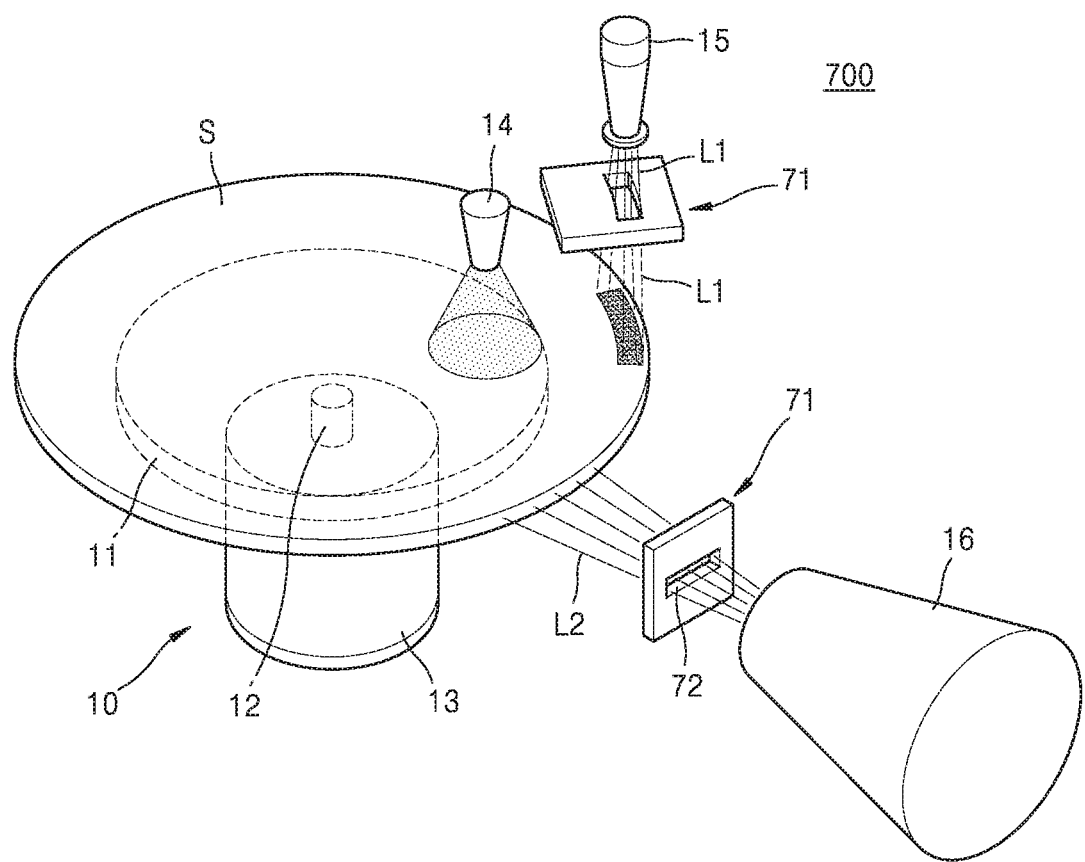

FIGS. 7A and 7B are diagrams of a substrate processing apparatus 700 according to an example embodiment.

Referring to FIGS. 7A and 7B, the substrate processing apparatus 700 may include the spin chuck 10, the chemical liquid nozzle 14, the first laser device 15, the second laser device 16, and a mask 71.

The spin chuck 10, the chemical liquid nozzle 14, the first laser device 15, and the second laser device 16 of the substrate processing apparatus 700 are the same as those illustrated with reference to FIG. 2, and detailed descriptions thereof are omitted.

The substrate processing apparatus 700 may further include the mask 71. The mask 71 may be located in front of at least one of the first laser device 15 and the second laser device 16.

The mask 71 may disperse an energy density of at least one of the first laser beam L1 emitted from the first laser device 15 and the second laser beam L2 emitted from the second laser device 16.

In detail, the mask 71 may increase energy density of the first laser beam L1 and the second laser beam L2 relatively on a region adjacent to the outside of the edge E of the substrate S, and may decrease the energy density of the first laser beam L1 and the second laser beam L2 on a region adjacent to the inside of the edge E of the substrate S. Accordingly, the energy density of the first laser beam L1 and the second laser beam L2 may be concentrated on the region adjacent to the outside of the edge E of the substrate S, and thus, an etched amount around the outside of the edge E of the substrate S may be relatively increased.

Referring to FIG. 7B, the mask 71 may include a void 72. The void 72 of the mask 71 may have various shapes for relatively increasing the energy density of the first laser beam L1 and the second laser beam L2 on the region adjacent to the outside of the edge E of the substrate S. For example, when at least one of the first laser beam L1 and the second laser beam L2 is condensed on the substrate S in a direction perpendicular to the substrate S, the mask 71 may have a void of an arc shape. The void having the arc shape may be similar to an outer portion of the edge E of the substrate S. In addition, when at least one of the first laser beam L1 and the second laser beam L2 is condensed on the substrate S in a direction in parallel with the substrate S at a level that is substantially equal to that of the substrate S, the mask 71 may have a void having a rectangular shape.

At least one of the first laser beam L1 and the second laser beam L2 passes through the void 72 of the mask 71 to concentrate the energy thereof on the region adjacent to the outside of the edge E of the substrate S.

Figure 8:
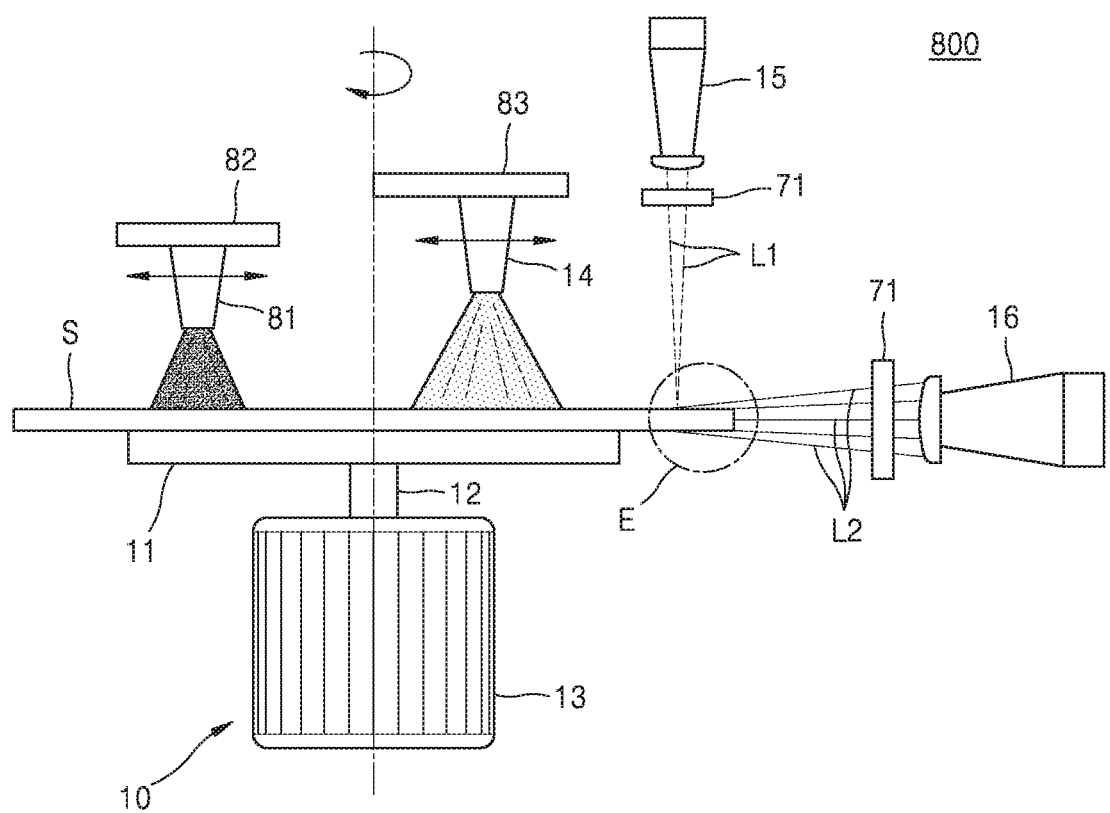
FIG. 8 is a diagram of a substrate processing apparatus according to an example embodiment.

FIG. 8 is a diagram of a substrate processing apparatus 800 according to an example embodiment.

The substrate processing apparatus 800 may further include a deionized water nozzle 81, a deionized water nozzle arm 82, and a chemical liquid nozzle arm 83.

The deionized water nozzle 81 may provide deionized water to the substrate S. The deionized water may be water for industrial purposes, in which dissolving ions are largely removed. The deionized water may be provided on the substrate S at a temperature of about 200 degrees to about 1000 degrees. However, the present invention is not limited thereto, that is, the deionzied water may be provided on the substrate S at various temperatures.

The deionized water nozzle 81 may provide the deionized water to the substrate S when the second laser beam L2 of the second laser device 16 is condensed on the substrate S. The deionized water on the substrate S provided from the deionized water nozzle 81 may absorb relatively small amount of energy of the second laser beam L2 emitted from the second laser device 16. Accordingly, the energy of the second laser beam L2 may be mostly used to etch the edge E of the substrate S. Also, since a little amount of energy of the second laser beam L2 may be used to increase a temperature of the deionized water, rapid increase in a temperature of the substrate S during the etching process on the edge E of the substrate S may be reduced (or, alternatively, prevented) and damage to the substrate S may be reduced (or, alternatively, prevented).

The deionized water nozzle 81 may provide the deionized water to the substrate S when the etching process performed by the first laser device 15 and the second laser device 16 is finished or suspended. The deionized water cleans the chemical liquid provided on the substrate S in the etching process on the edge E of the substrate S. Also, the deionized water may remove foreign matters that are etched during the etching process on the substrate S and then accumulated on the surface of the substrate S.

The deionized water may be evenly applied from the center of the substrate S towards the edge E due to a centrifugal force generated by the rotation of the substrate S.

The deionized water nozzle arm 82 of the substrate processing apparatus 800 may control a location of the deionized water nozzle 81. Accordingly, a location of providing the deionized water on the substrate S may vary. The deionized water nozzle arm 82 may move the deionized water nozzle 82 in a diameter direction of the spin base 11 of the substrate S. For example, the deionized water nozzle 81 sprays the deionized water above the vicinity of the edge E of the substrate S so that the deionized water may be only applied around the edge E of the substrate S. Also, the deionized water nozzle 81 may spray the deionized water above the center of the substrate S so that the deionized water may be evenly applied to an entire surface of the substrate S.

The chemical liquid nozzle arm 83 of the substrate processing apparatus 800 may flexibly adjust a location of the chemical liquid nozzle 14 under the control of the process manager. Accordingly, a location of providing the chemical liquid on the substrate S may vary.

The deionized water nozzle arm 82 and the chemical liquid nozzle arm 83 may be separately controlled from each other. Therefore, the deionized water nozzle arm 82 and the chemical liquid nozzle arm 83 may be sequentially operated or simultaneously operated.

Figure 9:
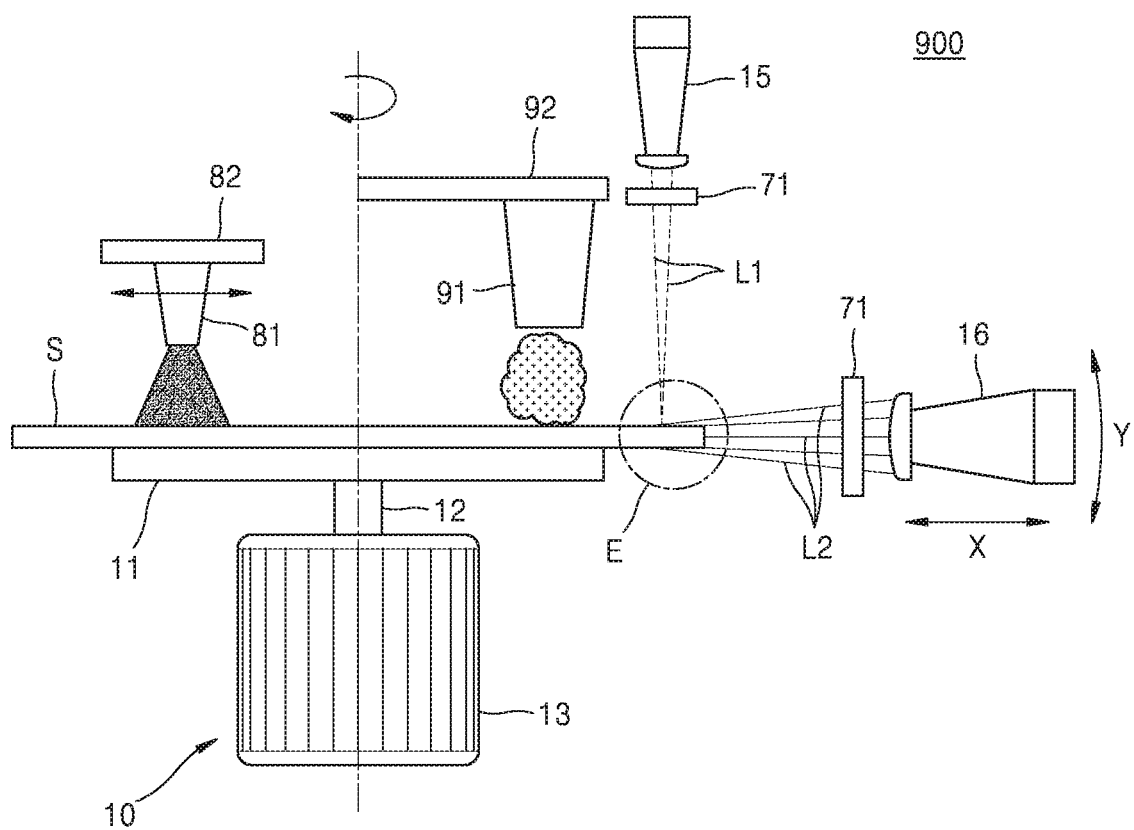
FIG. 9 is a diagram of a substrate processing apparatus according to an example embodiment.

FIG. 9 is a diagram of a substrate processing apparatus 900 according to an example embodiment.

Referring to FIG. 9, the substrate processing apparatus 900 according to the example embodiment may include the spin chuck 10, the first laser device 15, the second laser device 16, the mask 71, the deionized water nozzle 81, the deionized water nozzle arm 82, a gas nozzle 91, and a gas nozzle arm 92.

Since the spin chuck 10, the first laser device 15, the second laser device 16, the mask 71, the deionized water nozzle 81, and the deionized water nozzle arm 82 are substantially the same as those described above with reference to FIGS. 2 to 8, detailed descriptions thereof are omitted.

The gas nozzle 91 of the substrate processing apparatus 900 according to the example embodiment may provide a chemical gas for semiconductor to the edge E of the substrate S for etching the edge E of the substrate S. The gas nozzle 91 may be located above the spin chuck 10. The process manager may adjust a spraying pressure of the chemical gas from the gas nozzle 91, so that the chemical gas may be highly concentrated on the edge E of the substrate S.

The chemical gas provided from the gas nozzle 91 may selectively etch only some of various components included in the substrate S. In more detail, when the process manager wants to selectively etch metal-based components from the edge E of the substrate S, the process manager may provide a chemical gas generating chemical reaction only with the metal-based components onto the substrate S via the gas nozzle 91. The chemical gas sprayed from the gas nozzle 91 may include various semiconductor chemical gases. The chemical gas, for example, may include $BCl_3$, $C_2HF_5$, $Cl_2$, $ClF_3$, $CF_4$, $CHF_3$, $CH_2F_2$, $CH_3F$, $NF_3$, $C_2F_6$, and $SF_6$. However, one or more example embodiments are not limited thereto, and the chemical gas may include various combinations of the above chemical gases.

An etched amount of the substrate S by the chemical gas may vary depending on the chemical gas and the temperature of the substrate S. In other words, after providing the chemical gas to the edge E of the substrate S, the process manager may adjust the etched amount of the substrate S due to the chemical gas by controlling the temperature of the substrate S and the temperature of the chemical gas. In more detail, the process manager may control the etched amount at the edge E of the substrate S by adjusting parameters such as the intensity or period of the first laser beam L1 emitted from the first laser device 15 and adjusting the temperatures of the chemical gas and the edge E of the substrate S.

The gas nozzle arm 92 may adjust the location of the gas nozzle 91. Accordingly, a location of providing the chemical gas on the substrate S may vary.

The second laser device 16 of the substrate processing apparatus 900 emits the second laser beam L2 to directly etch the edge E of the substrate S. Here, the second laser beam L2 emitted from the second laser device 16 may be the ultra-short pulse wave having a period of 10-9 seconds or less.

As described above with reference to FIG. 4, the second laser device 16 may include a light emitter 41, the light transfer portion 42, the lens portion 43, the first driver 44, and the second driver 45. The first driver 44 and the second driver 45 of the second laser device 16 may drive the second laser device 16 in the first direction X that is the width direction of the substrate S and in the second direction Y that is the height direction of the substrate S.

The substrate processing apparatus 900 may include the mask 71 in front of at least one of the first laser device 15 and the second laser device 16. The mask 71 may disperse an energy density of at least one of the first laser beam L1 emitted from the first laser device 15 and the second laser beam L2 emitted from the second laser device 16.

The mask 71 may be located in front of at least one of the first laser device 15 and the second laser device 16. The mask 71 may disperse an energy density of at least one of the first laser beam L1 emitted from the first laser device 15 and the second laser beam L2 emitted from the second laser device 16. The energy density of the first laser beam L1 and the second laser beam L2 may increase at the vicinity of the outside of the edge E of the substrate S while passing through the mask 71, and accordingly, the edge E of the substrate S may be effectively etched.

Figure 10:
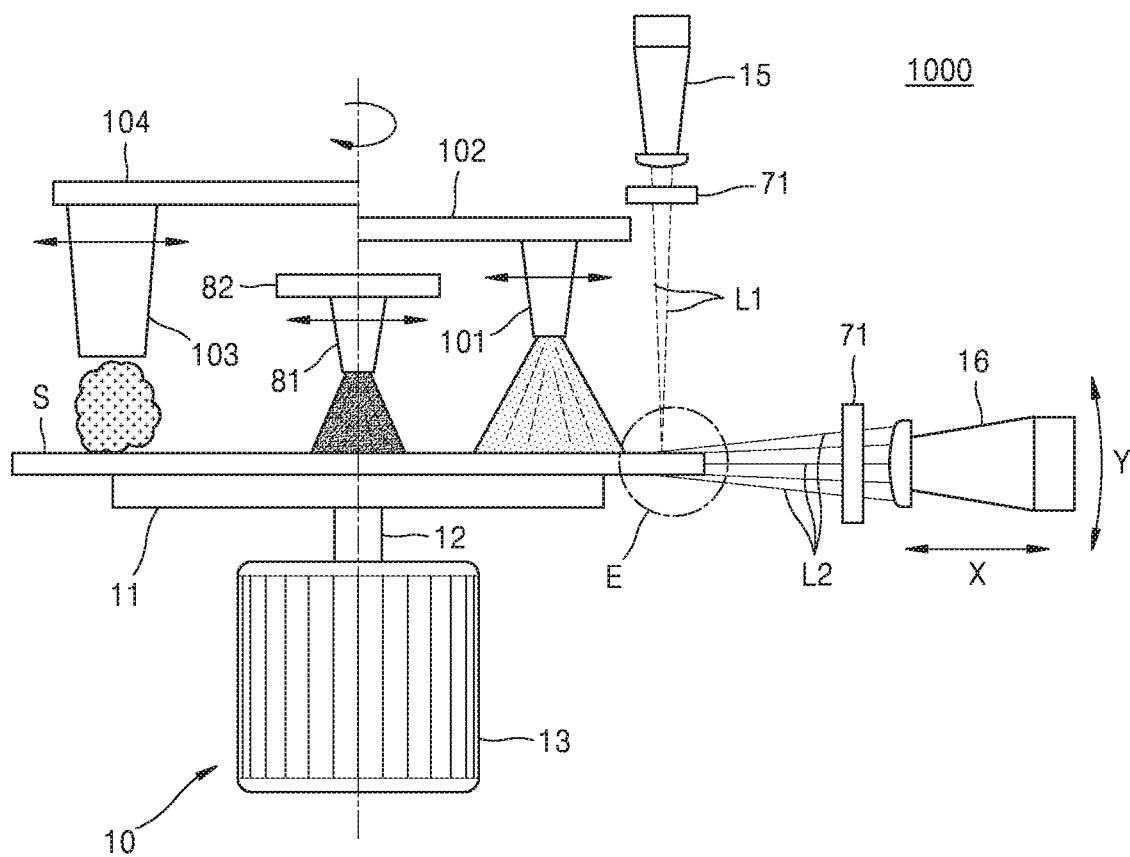
FIG. 10 is a diagram of a substrate processing apparatus according to an example embodiment.

FIG. 10 is a diagram of a substrate processing apparatus 1000 according to an example embodiment.

The substrate processing apparatus 1000 according to the embodiment may include the spin chuck 10, the first laser device 15, the second laser device 16, the mask 71, the deionized water nozzle 81, the deionized water nozzle arm 82, a chemical liquid nozzle 101, a chemical liquid nozzle arm 102, a gas nozzle 103, and a gas nozzle arm 104.

The above elements of the substrate processing apparatus 1000 are substantially the same as those described above with reference to FIGS. 2 to 9, and detailed descriptions thereof are omitted.

Figure 11:
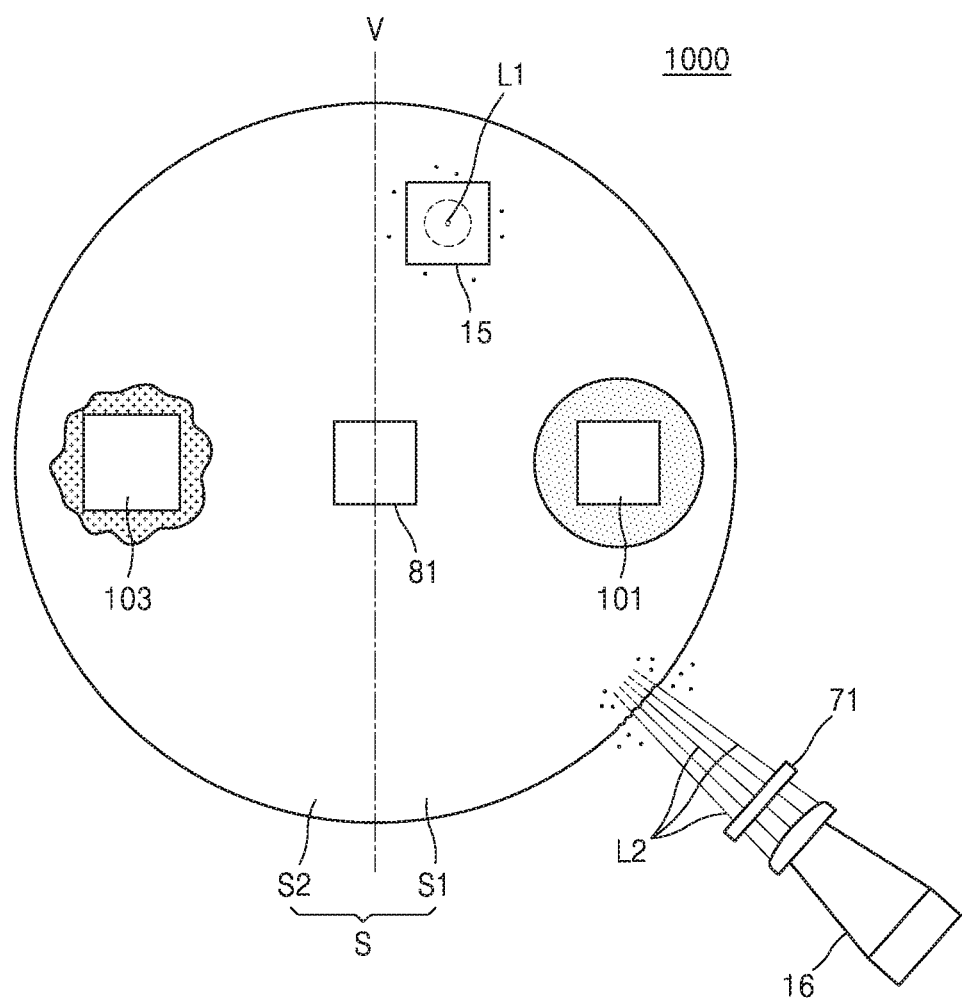
FIG. 11 is a plan view of a substrate processing apparatus according to an example embodiment.

FIG. 11 is a plan view of the substrate processing apparatus 1000 according to an example embodiment.

Referring to FIG. 11, the chemical liquid nozzle 101 and the gas nozzle 103 of the substrate processing apparatus 1000 may be arranged opposite to each other based on a center of the substrate S to be spaced apart from each other. In more detail, when the substrate S is partitioned as a first region S1 and a second region S2 based on a virtual line V passing through the center of the substrate S, the chemical liquid nozzle 101 may be located at the first region S1 of the substrate S and the gas nozzle 103 may be located at the second region S2 of the substrate S.

In addition, the first laser device 15 of the substrate processing apparatus 1000 may be adjacent to the chemical liquid nozzle 101 in the first region S1 of the substrate S. The first laser beam L1 emitted from the first laser device 15 heats the edge E of the substrate S and the chemical liquid provided from the chemical liquid nozzle 101 to selectively etch the edge E of the substrate S.

A region of the substrate S heated by the first laser beam L1 may be located under the gas nozzle 103 due to the rotation of the spin chuck 10. The gas nozzle 103 provides the chemical gas to the substrate S that is pre-heated, the etched amount of the edge E of the substrate S may be increased.

As described above, since the chemical liquid nozzle 101 and the gas nozzle 103 are arranged at opposite sides based on the center of the substrate S in the substrate processing apparatus 1000, unnecessary chemical reactions between the chemical liquid provided from the chemical liquid nozzle 101 and the chemical gas provided from the gas nozzle 103 may be reduced.

The chemical liquid nozzle 101 and the gas nozzle 103 may be separately controlled. Accordingly, the chemical liquid nozzle 101 and the gas nozzle 103 may simultaneously operate, and the edge E of the substrate S may be rapidly etched. However, one or more embodiments are not limited thereto, that is, the chemical liquid nozzle 101 and the gas nozzle 103 may be sequentially operated under the control of the process manager.

The chemical liquid provided from the chemical liquid nozzle 101 and the chemical gas provided from the gas nozzle 103 may selectively etch the edge E of the substrate S. As described above, the process manager may select various chemical liquids and chemical gases according to the components etched from the edge E of the substrate S.

Also, the component of the substrate S etched by the chemical liquid and the component of the substrate S etched by the chemical gas may be different from each other. For example, the chemical liquid provided from the chemical liquid nozzle 101 may selectively etch the silicon-based components from the substrate S, and the chemical gas provided from the gas nozzle 103 may selectively etch the metal-based components from the substrate S. Accordingly, the substrate processing apparatus 1000 may rapidly and simultaneously etch various components from the edge E of the substrate S, according to selection of the process manager.

The second laser device 16 of the substrate processing apparatus 1000 emits the second laser beam L2 to directly etch the edge E of the substrate S. Here, the second laser beam L2 emitted from the second laser device 16 may be the ultra-short pulse wave having a period of $10^{-9}$ seconds or less. As described above, the second laser device 16 may drive in at least one of the first direction X that is the width direction of the substrate S and the second direction Y that is the height direction of the substrate S.

The substrate processing apparatus 1000 may selectively etch certain components of the edge E of the substrate S, by including the first laser device 15, the chemical liquid nozzle 101, and the gas nozzle 103. Also, by using the second laser device 16, the substrate processing apparatus 1000 may directly etch the edge E of the substrate S while reducing (or, alternatively preventing) damage to the substrate S.

The deionized water nozzle 81 of the substrate processing apparatus 1000 may be located near the center of the substrate S. The deionized water provided near the center of the substrate S from the deionized water nozzle 81 may be evenly applied onto the substrate S due to the rotation of the spin chuck 10. As described above, the deionized water prevents the temperature of the substrate S from rapidly increasing due to the second laser beam L2 from the second laser device 16 in order to prevent damage to the substrate S. The deionized water may clean the substrate S by washing the chemical liquid and the chemical gas provided on the substrate S.

The deionized water nozzle 81, the chemical liquid nozzle 101, and the gas nozzle 103 of the substrate processing apparatus 1000 may be respectively connected to the deionized water nozzle arm 82, the chemical liquid nozzle arm 102, and the gas nozzle arm 104. Accordingly, locations of the deionized water nozzle 81, the chemical liquid nozzle 101, and the gas nozzle 103 may vary, and the locations of providing the deionized water, the chemical liquid, and the chemical gas onto the substrate S may also vary. Since the deionized water nozzle 81, the chemical liquid nozzle 101, and the gas nozzle 103 may be individually controlled, the deionized water nozzle 81, the chemical liquid nozzle 101, and the gas nozzle 103 may simultaneously or sequentially operate.

Figure 12:
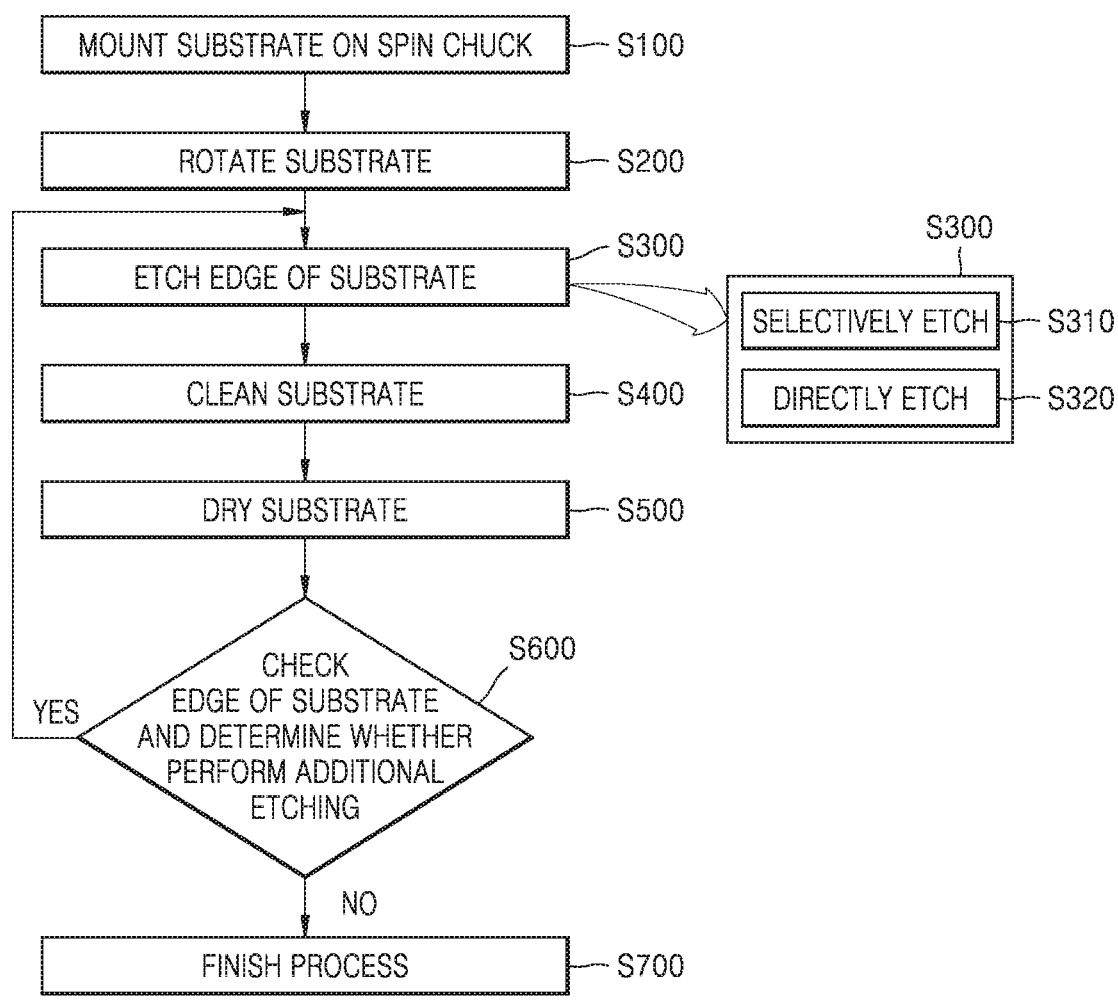
FIG. 12 is a flowchart illustrating a substrate processing method according to an example embodiment.

FIG. 12 is a flowchart illustrating a substrate processing method according to an example embodiment.

Referring to FIG. 12, in operation S100 of the substrate processing method according to the example embodiment, the substrate S may be mounted on the spin chuck 10. The substrate S may be firmly mounted on the spin base 11 of the spin chuck 10 due to an electrostatic force generated between the substrate S and the spin chuck 10.

In operation S200, after the substrate S is mounted on the spin base 11 of the spin chuck 10, the substrate processing method may include an operation of rotating the substrate.

For example, the spin tool 13 of the spin chuck 10 may transfer a rotary force to the rotary shaft 12, and the rotary shaft 12 may transfer the rotary force to the spin base 11. As the spin base 11 rotates, the substrate S on the spin base 11 may rotate by an angular velocity that is substantially equal to a rotating angular velocity of the spin base 11. The rotating angular velocity of the spin base 11 may be adjusted according to a control signal of a controller that is electrically connected to the spin tool 13.

In operation S300, when the substrate S rotates due to the spin chuck 10, the substrate processing method may include an operation of etching the edge E of the substrate S.

In some example embodiments, the operation of etching the edge E of the substrate S may include performing a selective etching operation S310, in which the edge E of the substrate S is selectively etched, and a direct etching operation S210, in which the edge E of the substrate S is directly etched.

The selective etching operation (S310) may include selectively etching only a certain component among various components of the substrate S under the control of the process manager.

As described above with reference to FIGS. 2 to 11, the etched components from the edge E of the substrate S may vary depending on the kinds of the chemical liquid and/or the chemical gas provided on the substrate S.

The first laser beam L1 of the first laser device 15 may increase the etched amount and the etching speed on the edge E of the substrate S by the chemical liquid or the chemical gas by heating the substrate S, the chemical liquid, and the chemical gas. The process manager may control the etched amount and the etching speed at the edge E of the substrate S by adjusting the parameters such as the intensity, the period, etc. of the first laser beam L1 from the first laser device 15.

The direct etching operation (S320) may include directly etching the edge E of the substrate S by condensing the laser beam on the edge E of the substrate S.

As described above with reference to FIGS. 2 to 11, the second laser beam L2 of the second laser device 16 may be condensed on the edge E of the substrate S, and the second laser beam L2 may directly etch the edge E of the substrate S. The second laser beam L2 may be the ultra-short pulse wave, and accordingly, the second laser beam L2 may etch the edge E of the substrate S without increasing the temperature on the edge E of the substrate S so as to reduce (or, alternatively, prevent) damage to the substrate S due to the heat.

As described above, the second laser device 16 may be driven in at least one of the first direction X that is the width direction of the substrate S and the second direction Y that is the height direction of the substrate S, and accordingly the second laser device 16 may etch at least one portion of the front portion, the side portion, and the rear portion of the edge E of the substrate S.

In some example embodiments, the direct etching operation of the substrate S (S320) may include providing the deionized water to the substrate S. The deionized water may reduce (or, alternatively, prevent) the temperature of the substrate S from rapidly increasing due to the second laser beam L2 from the second laser device 16 in order to reduce (or, alternatively, prevent) damage to the substrate S.

The selective etching operation S310 and the direct etching operation S320 may be performed at the same time. However, one or more example embodiments are not limited thereto, that is, the selective etching operation S310 and the direct etching operation S320 may be sequentially performed.

That is, the process manager may etch the edge E of the substrate S by selecting only one of the selective etching operation S310 and the direct etching operation S320 according to the state on the edge E of the substrate S. Alternatively, the process manager may rapidly etch the edge E of the substrate S by performing the selective etching operation S310 and the direct etching operation S320 at the same time.

In operation S400, after etching the edge E of the substrate S, the substrate processing method may include an operation of cleaning the substrate.

For example, the controller may control the water nozzle arm 82 and the water nozzle 81 to provide deionized water to the substrate S. The deionized water provided to the substrate S may be evenly applied from the center to the edge E of the substrate S due to the centrifugal force generated by the rotation of the substrate S.

The deionized water provided to the substrate S may wash the foreign matters that are flown to and accumulated on the substrate S after being etched from the edge E of the substrate S in the etching operation S300, so as to reduce (or, alternatively, prevent) damage to the substrate S due to the foreign matters. The deionized water provided to the substrate S may also wash the chemical liquid and/or the chemical gas provided on the substrate S to clean the substrate S.

Although not shown in FIG. 12, in the operation of cleaning the substrate S, an operation of additionally etching the edge E of the substrate S may be performed according to the control of the process manager. For example, when the process manager determines that the edge E of the substrate S needs to be further etched in the operation of cleaning the substrate S (S400), the process manager may directly etch the edge E of the substrate S by the second laser beam L2 by operating the second laser device 16 in the operation of cleaning the substrate S (S400).

In operation S500, after cleaning the substrate, the substrate processing method may include an operation of drying the substrate.

For example, the substrate S may be dried to reduce (or, alternatively, prevent) the damage to the substrate S due to the deionized water and/or the chemical liquid on the surface of the substrate S by drying the surface of the substrate S.

Although not shown in FIG. 12, in the operation of drying the substrate S, an operation of additionally etching the edge E of the substrate S may be performed according to the convenience of the process manager. For example, when the process manager determines that the edge E of the substrate S needs to be further etched in the operation of drying the substrate S, the process manager may directly etch the edge E of the substrate S by the second laser beam L2 by operating the second laser device 16 in the operation of drying the substrate S (S500).

In operation S600, an etched state of the edge E of the substrate S may be checked to determine whether the additional etching on the edge E of the substrate S is desired (or, alternatively, necessary).

For example, the process manager may check in real-time the etched state of the edge E of the substrate S via the camera observer 61 illustrated above with reference to FIG. 6.

When the process manager determines that there is no need to additionally etch the edge E of the substrate S (NO) after observing the edge E of the substrate S, in operation S700, the process manager may finish the etching processes of the edge E of the substrate S.

When the process manager determines that there is a need to additionally etch the edge E of the substrate S (YES) after observing the edge E of the substrate S, the controller may again perform operation S300 of etching the edge E of the substrate S, the operation S400 of cleaning the substrate S and the operation S500 of drying the substrate S.

While example embodiments of the inventive concepts have been particularly shown and described with reference to some example embodiments thereof, it will be understood that various changes in form and details may be made therein without departing from the spirit and scope of the following claims.

What is claimed is:

1. A substrate processing apparatus comprising:
   a spin chuck configured to rotate a substrate mounted to a top surface thereof;
   at least one of a chemical liquid nozzle configured to provide a chemical liquid to a surface of the substrate and a deionized water nozzle configured to provide a deionized water to a surface of the substrate; and
   a first laser device including a first laser beam emitter configured to emit a first laser beam from a position above the substrate to heat the substrate and at least one of the chemical liquid on the substrate and the deionized water on the substrate such that an edge of the substrate is not irradiated with the first laser beam, the first laser beam being a continuous wave; and
   a second laser device including a second laser beam emitter configured to emit a second laser beam from a position parallel to the top surface of the spin chuck to etch the edge of the substrate, the second laser beam being a pulse wave having a period different from a period of the first laser beam and in a range of 10 nanoseconds ($\eta$ seconds) or less such that an upper surface of the substrate is not irradiated with the pulse wave having the period of 10 $\eta$ seconds or less, wherein
   the first laser device and the second laser device are arranged such that the second laser beam that etches the edge of the substrate with the pulse wave is perpendicular to the first laser beam that heats the at least one of the chemical liquid on the substrate and the deionized water on the substrate using the continuous wave.

2. The substrate processing apparatus of claim 1, wherein the chemical liquid is provided on the substrate at a temperature of 200° C. to 1000° C.

3. The substrate processing apparatus of claim 1, wherein the second laser device comprises:
   a light transfer device configured to transfer the second laser beam;
   a lens configured to condense the second laser beam; and
   a driver configured to drive the second laser device in at least one of a first direction and a second direction, the first direction being a width direction of the substrate and the second direction being a height direction of the substrate.

4. The substrate processing apparatus of claim 1, further comprising:
   a mask configured to scatter an energy density of at least one of the first laser beam and the second laser beam.

5. The substrate processing apparatus of claim 1, further comprising:
   a deionized water nozzle arm configured to move the deionized water nozzle.

6. A substrate processing apparatus comprising:
   a spin chuck configured to rotate a substrate mounted to a top surface thereof;
   a chemical liquid nozzle configured to provide a chemical liquid to a surface of the substrate;
   a gas nozzle configured to provide a chemical gas to the surface of the substrate;
   a first laser device including a first laser beam emitter configured to emit a first laser beam to heat the substrate and the chemical liquid from a position above the substrate such that an edge of the substrate is not irradiated with the first laser beam, the first laser beam being a continuous wave; and
   a second laser device including a second laser beam emitter configured to emit a second laser beam from a position parallel to the top surface of the spin chuck to etch the edge of the substrate, the second laser beam being a pulse wave, the second laser beam emitter configured to emit the second laser beam such that the pulse wave has a period different from a period of the first laser beam and in a range of 10 nanoseconds ($\eta$ seconds) or less such that an upper surface of the substrate is not irradiated with the pulse wave having the period of 10 $\eta$ seconds or less, wherein
   the first laser device and the second laser device are arranged such that the second laser beam that etches the edge of the substrate with the pulse wave is perpendicular to the first laser beam that heats the chemical liquid on the substrate using the continuous wave.

7. The substrate processing apparatus of claim 6, wherein the chemical liquid nozzle and the gas nozzle are spaced apart from each other such that the chemical liquid nozzle and the gas nozzle are opposite each other based on a center of the substrate.

8. The substrate processing apparatus of claim 7, wherein the substrate processing apparatus is configured to supply the chemical liquid and the chemical gas such that the chemical liquid is configured to etch a first component of the substrate and the chemical gas is configured to etch a second component of the substrate different from the first component.

9. The substrate processing apparatus of claim 6, wherein the second laser device comprises:
   a light transfer device configured to transfer the second laser beam;
   a lens configured to condense the second laser beam; and
   a driver configured to drive the second laser device in at least one of a first direction and a second direction, the first direction being a width direction of the substrate and the second direction being a height direction of the substrate.

10. The substrate processing apparatus of claim 6, further comprising:
   a deionized water nozzle configured to provide deionized water to the surface of the substrate; and
   a deionized water nozzle arm configured to move the deionized water nozzle, wherein
      a controller includes a processor configured to independently control the chemical liquid nozzle, the gas nozzle, and the deionized water nozzle.

\* \* \* \* \*